US007021738B2

(12) United States Patent
Juan et al.

(10) Patent No.: US 7,021,738 B2
(45) Date of Patent: Apr. 4, 2006

(54) MULTI-COLOR PRINTER

(75) Inventors: Fernando Juan, Barcelona (ES); Eduardo Martin, Sant Cugat del Valles (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 155 days.

(21) Appl. No.: 10/683,785

(22) Filed: Oct. 10, 2003

(65) Prior Publication Data

US 2005/0078137 A1 Apr. 14, 2005

(51) Int. Cl.
*B41J 29/393* (2006.01)
*H03M 1/22* (2006.01)

(52) U.S. Cl. .............................. 347/19; 347/4; 341/11

(58) Field of Classification Search .................. 347/19, 347/4, 139, 11; 399/116–117; 341/11–13
See application file for complete search history.

(56) References Cited

U.S. PATENT DOCUMENTS

| | | | | |
|---|---|---|---|---|
| 4,786,803 | A | 11/1988 | Majette et al. | |
| 4,789,874 | A | 12/1988 | Majette et al. | |
| 5,206,645 | A | 4/1993 | Urich | |
| 5,300,961 | A | 4/1994 | Corona et al. | |
| 5,411,340 | A | 5/1995 | Elgee | |
| 5,579,092 | A | 11/1996 | Isobe et al. | |
| 5,587,771 | A | 12/1996 | Mori et al. | |
| 6,089,693 | A | 7/2000 | Drake et al. | |
| 6,155,669 | A | 12/2000 | Donahue et al. | |
| 6,335,748 | B1 | 1/2002 | Furst | |
| 2003/0128253 | A1 | 7/2003 | Kitahara et al. | |
| 2005/0078015 | A1 * | 4/2005 | Ferran et al. | 341/11 |
| 2005/0185009 | A1 * | 8/2005 | Claramunt et al. | 347/16 |

FOREIGN PATENT DOCUMENTS

| | | |
|---|---|---|
| EP | 0494105 | 7/1992 |
| EP | 1226954 | 7/2002 |

* cited by examiner

*Primary Examiner*—Lamson Nguyen

(57) ABSTRACT

A multicolor-printer has a plurality of print stations arranged to generate an image on a recording medium, and a recording medium conveyor. A plurality of similar encoding marks are associated with the conveyor. Sensor arrangements are associated with the print stations, responsive to the encoding marks. They generate signals indicating the conveyor movement with respect to the corresponding print station. An index marking is indicative of a conveyor reference position. The sensor arrangements are responsive to it, thereby providing information about the reference position with respect to the corresponding print station. The printer registers images of different print stations with each other based on the movement and reference-position information.

24 Claims, 7 Drawing Sheets

*Fig. 2*
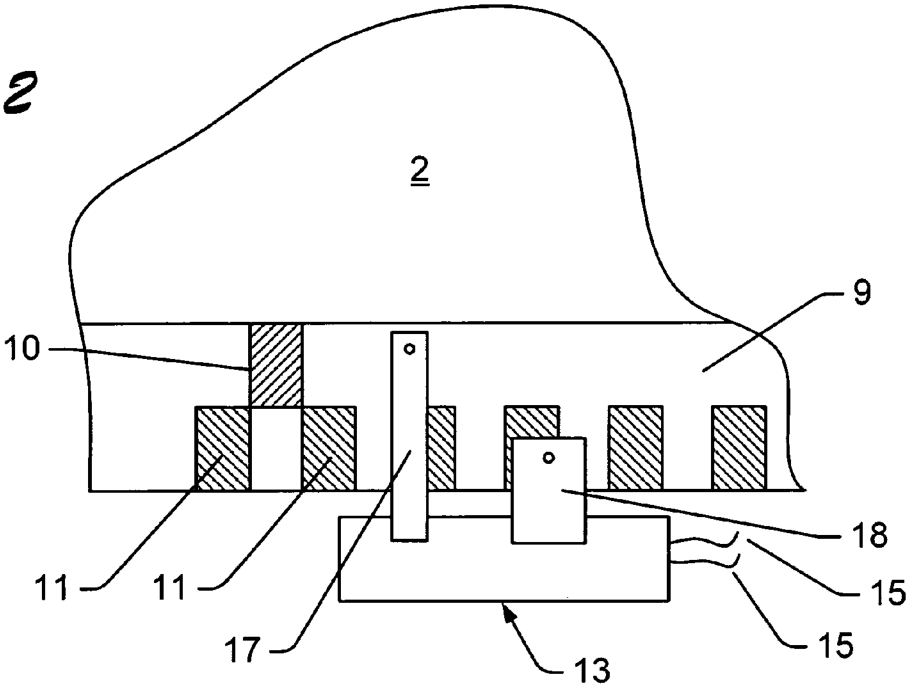
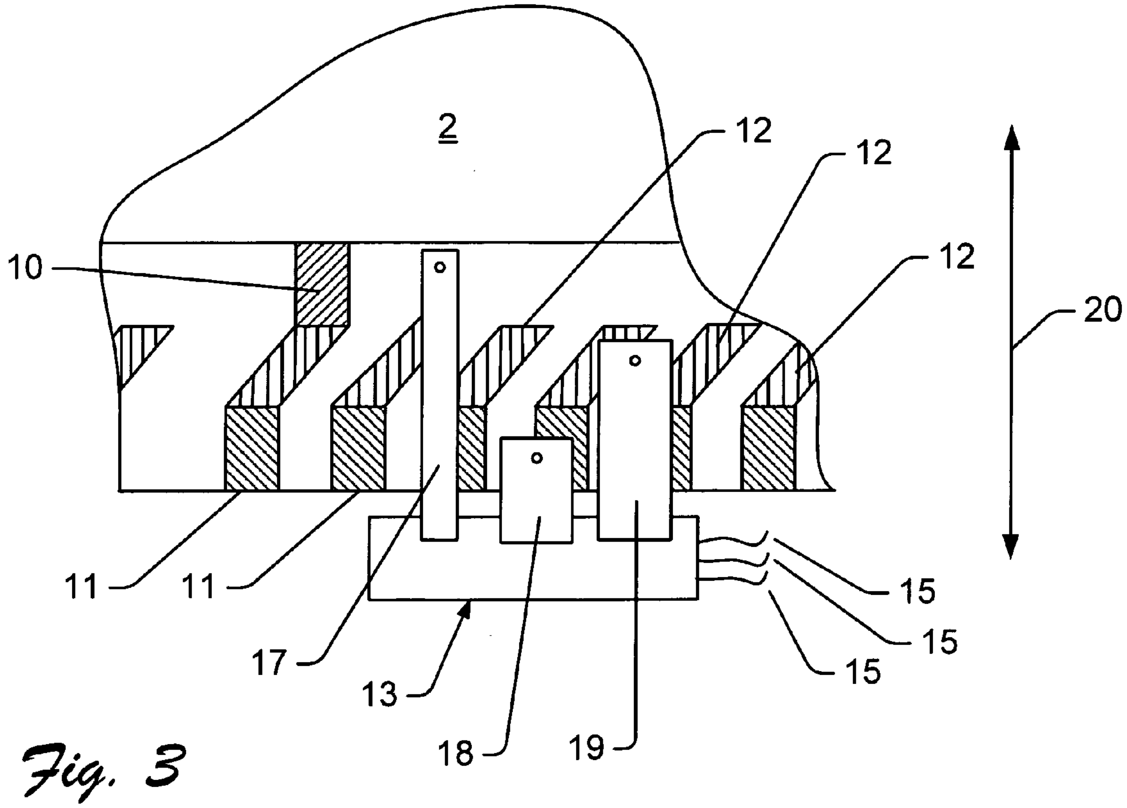
*Fig. 3*

MULTI-COLOR PRINTER

FIELD OF THE INVENTION

The present invention relates to multicolor printers and methods of printing images.

BACKGROUND OF THE INVENTION

Multicolor printers generate images which are composed of a plurality of different single-color images. The quality of the final multicolor image depends on the registration accuracy of the single-color images. With the increasing resolution of modern printers the registration accuracy has become an issue of interest.

Different multicolor printer types are known. Ink-jet printers have at least one print head from which droplets of ink are directed towards a recording medium. Within the print head the ink is contained in a plurality of channels. Pulses cause the droplets of ink to be expelled as required from orifices or nozzles at the end of the channels. These pulses are generated e.g. by thermal components in thermal ink-jet print heads or by piezo-electric elements in drop-on-demand print heads. Ink-jet printers of the carriage type have a print head for each color. The print heads are mounted on a reciprocating carriage. Full width or page width ink-jet printers have, for each color, an array of nozzles extending across the full width of the print medium which is moved past the nozzle arrays. Each nozzle array is part of a print station which produces one single-color image or a part of it. Each print station provides its own color image or pattern on the recording medium as it moves past the print stations. Each pattern is formed of a plurality of closely spaced ink dots, wherein single-color ink dot patterns are superimposed to form a multicolor pattern which represents the multicolor image. The print medium may be paper or any other suitable substrate to which the ink adheres.

In known color xerographic systems, instead of the nozzle arrays, a plurality of LED print bars are provided adjacent to a photoreceptive surface. The print bars are selectively energized to create successive charge patterns, one for each color. Each LED print bar is associated with a development system, which develops a latent image of the last charge pattern or exposure without disturbing previously developed images. The fully developed color image is then transferred to an output sheet, e.g. paper or the like.

To register single-color image patterns for forming a multicolor image, encoder arrangements are utilized which determine the advance of the recording medium during the print process. Optical encoder systems are known in which an optical sensor is responsive to encoder marks.

In page-width printers the recording medium is, for example, moved by a conveying belt which is driven by rollers or pulleys. The movement of the belt with the recording medium may be detected by a single rotary encoder which is mounted on one of the rollers or pulleys. The advance of the belt is controlled by advance information represented by the rotary encoder signals. It is also known to place the encoder marks on the belt.

U.S. Pat. No. 6,155,669 discloses an ink-jet printer with several print stations and a conveying belt with encoding marks. Each print station has its own optical reader responsive to the encoding marks to generate its own position signal.

SUMMARY OF THE INVENTION

A first aspect of the invention is directed to a multicolor-printer. According to the first aspect, it comprises a plurality of print stations arranged to generate an image on a recording medium during the movement of the recording medium; a recording medium conveyor; a plurality of similar encoding marks arranged along the conveyor, sensor arrangements associated with the print stations, responsive to the encoding marks and arranged to generate signals providing information about the movement of the conveyor with respect to the corresponding print station; and at least one index marking indicative of a reference position of the conveyor. The sensor arrangements are arranged to generate a signal responsive to the index marking. They thereby provide information about the position of the conveyor with respect to the corresponding print station. The printer is arranged to register images of different print stations with each other based on the movement and reference-position information.

According to another aspect, a method is provided of printing images onto each other on a recording medium using a printer having a plurality of print stations and a recording medium conveyor equipped with a plurality of similar encoding marks and at least one index marking indicative of a reference position of the conveyor. The method comprises moving the conveyor in an advance direction, thereby detecting the index marking and the encoding marks and counting the encoding marks starting with the detection of the index marking at each print station; starting to print an image, by the first print station, and recording a corresponding encoding-mark count of the first print station; starting to print an image, by a subsequent print station in response to equality of the subsequent print station's encoding-mark count and the recorded first print station's encoding-mark count.

According to another aspect, a method is provided of printing images onto each other on a recording medium using a printer having a plurality of print stations and a recording medium conveyor equipped with a plurality of similar encoding marks and at least one index marking indicative of a reference position of the conveyor. The method comprises calibrating the distance between the print stations with reference to the encoding marks by moving the conveyor and detecting the index marking, when moved past the print stations, while detecting the corresponding encoding marks; moving the conveyor to print images on the recording medium while detecting the encoding marks at each print station, so as to obtain printing-station-related movement information; and registering the images being printed by the different print stations with each other based on the movement information and using the distance calibration.

According to another aspect, a multicolor-printer is provided which comprises a plurality of print stations arranged to generate an image on a recording medium; a conveyor arranged to move the recording medium in an advance direction; a plurality of similar first encoding marks arrange along the conveyor, sensor arrangements associated with the print stations, responsive to the first encoding marks and arranged to generate first signals providing information about the advance movement of the conveyor with respect to the corresponding print station; and second encoding marks associated with the conveyor and inclined to the first encoding marks. The sensor arrangements are arranged to also generate second signals from the second encoding marks, wherein the first and second signals are related and their relation bears information about a relative lateral conveyor displacement with respect to the corresponding print station. The printer is arranged to register images of different print stations with each other based on the movement and lateral-displacement information.

According to another aspect, a method is provided of printing images onto each other on a recording medium by means of a plurality of print stations. A recording medium conveyor equipped with a plurality of first and second encoding marks is used, wherein the second encoding marks are inclined to the first encoding marks. The conveyor is moved to print images on the recording medium while detecting the first and second encoding marks at each print station, wherein detection signals of the first and second encoding marks are related and their relation bears information about a relative lateral conveyor displacement with respect to the corresponding print station, so as to obtain printing-station-related movement and lateral-displacement information. The images being printed by the different print stations are registered with each other based on the movement and lateral-displacement information.

Other features are inherent in the products and methods disclosed or will become apparent to those skilled in the art from the following detailed description of embodiments and its accompanying drawings.

DESCRIPTION OF THE DRAWINGS

Embodiments of the invention will now be described, by way of example, and with reference to the accompanying drawings, in which:

FIG. 2 illustrates an embodiment of a sensor arrangement and a complementary belt with encoding marks and an index marking;

FIG. 3 illustrates another sensor arrangement and a complementary belt similar to FIG. 2, but with additional encoding marks;

DESCRIPTION OF THE PREFERRED EMBODIMENTS

Figure 1:
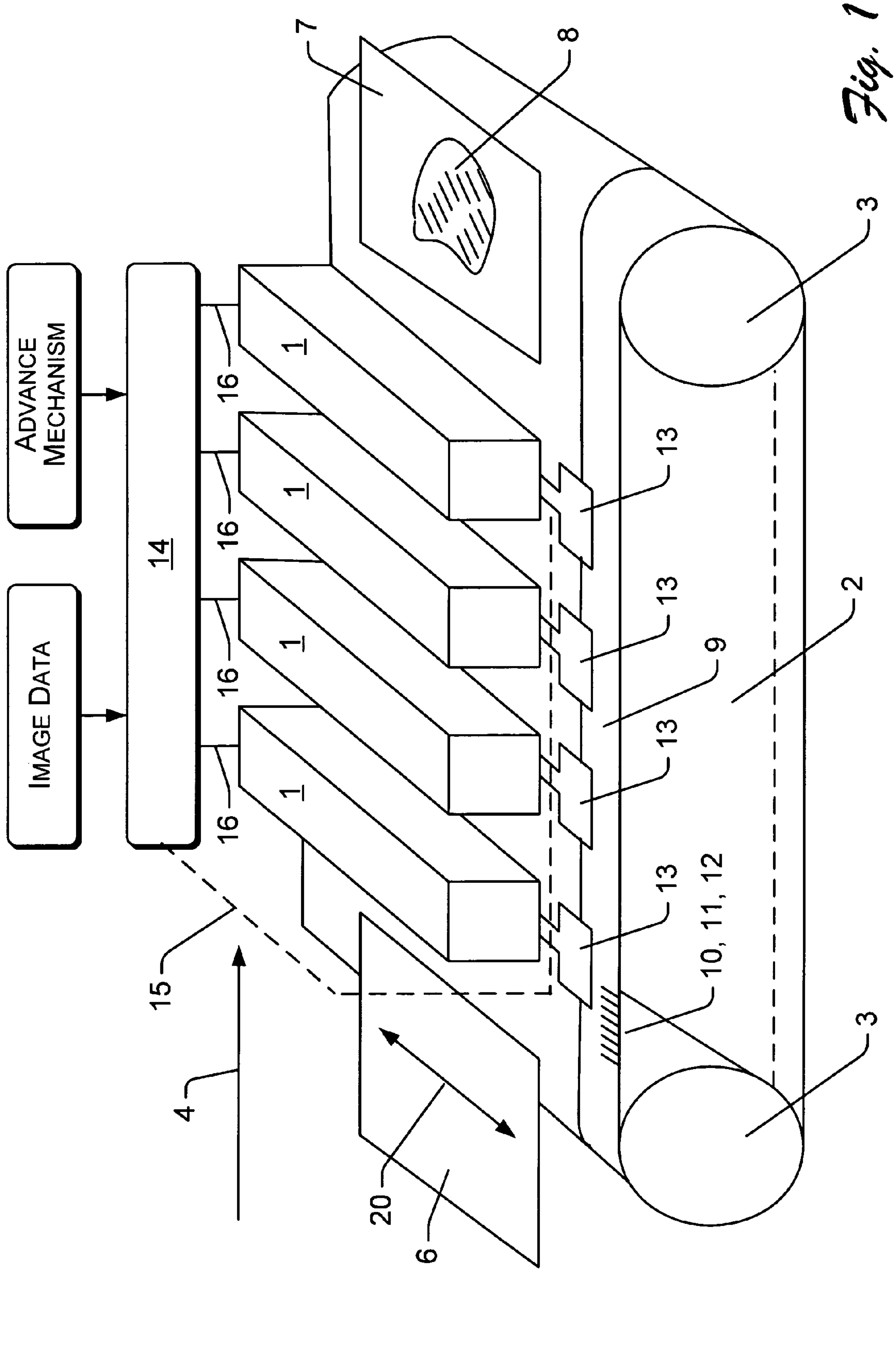
FIG. 1 shows a schematic view of functional components of a printer with a plurality of print stations.

FIG. 1 shows functional components of an embodiment of a multicolor printer. Prior to the detailed description of FIG. 1, a few items of the embodiments will be discussed.

Multicolor printers can utilize different methods of transferring an image to a print medium such as paper. In ink-jet printers the colors are directly transferred by liquid inks to the print medium. In color xerographic systems the complete image is generated on a photoreceptive surface which is subsequently transferred to the print medium e.g. the paper. In both cases the multicolor image is composed of a plurality of single-color images or "patterns" which are generated by different print stations. These single-color patterns are subsequently produced by the print stations across the print medium when it is moved past the print stations by a recording medium conveyor in an advance direction.

The conveyor can, for example, be a belt which carries the print medium on its surface, or a cylindrical drum which moves the print medium along the circumferential surface in a section where the image is applied. In embodiments in which a belt conveyor is utilized, the belt extends between rollers or pulleys which drive and guide the belt. In the area where the images are applied the print-medium-carrying surface of the belt defines a plane which is disposed opposite the print stations so that a print medium may be disposed between the belt and the print stations. The belt defines a movement path in the advance direction along which the print medium is conveyed during the printing process.

In the embodiments the print stations extend across the whole printing width of the belt and perpendicular to its advance direction. They are arranged subsequently in the printing direction. Each print station produces a single-color pattern e.g. in the colors black, cyan, yellow, and magenta. To increase the variety of printable colors, the ink saturation and/or the resolution, some embodiments are provided with two or more print stations of the same color.

The single-color patterns which form the desired multicolor image are applied by the print stations subsequently, registered onto each other. To achieve precise registration (i.e. alignment) of the single-color patterns onto each other, the belt is provided with a plurality of encoding marks (also called "fiducial marks"). The encoding marks are similar to one another, and they are arranged with equal distances to their respective neighboring encoding marks along the conveyor. The number of encoding marks passing a detector upon movement of the conveyor may be counted, thereby providing information about relative movements of the conveyor. The encoding marks may be provided on an edge of the belt in a section which is not to be printed on or covered by the print medium. The encoding section extends in a loop along the complete circumference of the belt. The marks may, for example, be printed or etched onto the surface of the belt or they are attached as a strip to the belt's edge, so that the marks are moved together with the belt.

A sensor arrangement responsive to the encoding marks is associated with each print station. The signals generated by the sensor arrangements with respect to each print station enable the advance of the belt to be individually determined with respect to each print station. The use of print-station-individual decoding information enables the print position error to be reduced and the registration accuracy to be increased, compared with printers having a common encoder for several print stations. This is now illustrated by FIGS. 8 and 9.

Figure 8:
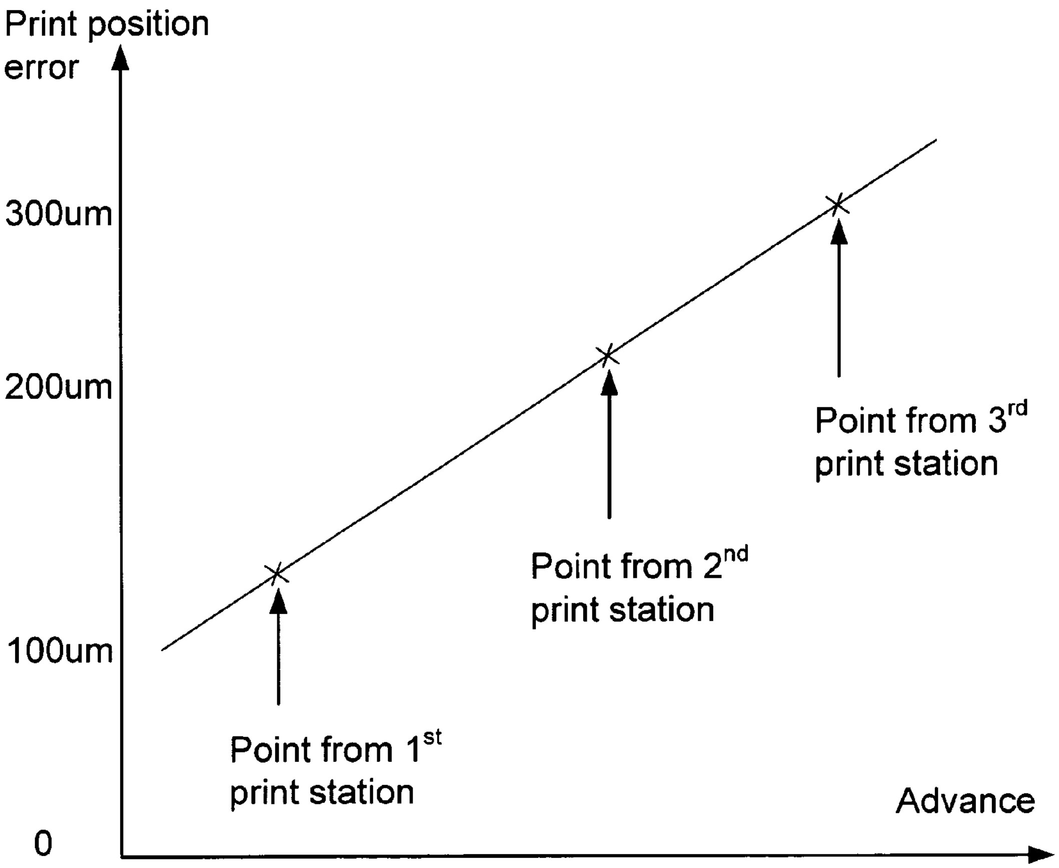
FIG. 8 is a diagram illustrating the print position error in a conventional printer with a single encoder.

FIG. 8 is a diagram of the print position error of a conventional printer with a common encoder for three print stations, as a function of the advance of the paper. Typically, an encoder has a systematic error (e.g. due to the fact that the assumed paper advance for one counted encoding mark deviates systematically from the real paper advance). The print position error is the accumulated error of the encoding error for a single encoding mark. It therefore grows with increasing paper advance. In FIG. 8, it is assumed that a point is to be printed at a theoretical position which requires a certain paper advance causing an accumulated error at the first print station of 120 μm. Such a deviation of the print position from the absolute theoretical position on the paper is irrelevant for most applications (because it only means that the printed image is shifted by 120 μm with respect to the paper margin). However, since the paper is further advanced in order to reach the second and third print stations, the accumulated encoding error is 220 μm at the second print station and 320 μm at the third print station (assuming that the distance between two consecutive print stations corresponds to an additional cumulative encoding error of 100 μm). Thus, the real print positions of the three print stations (which, for example, ought to print dots of different colors onto each other) are drawn apart by 200 μm.

Figure 9:
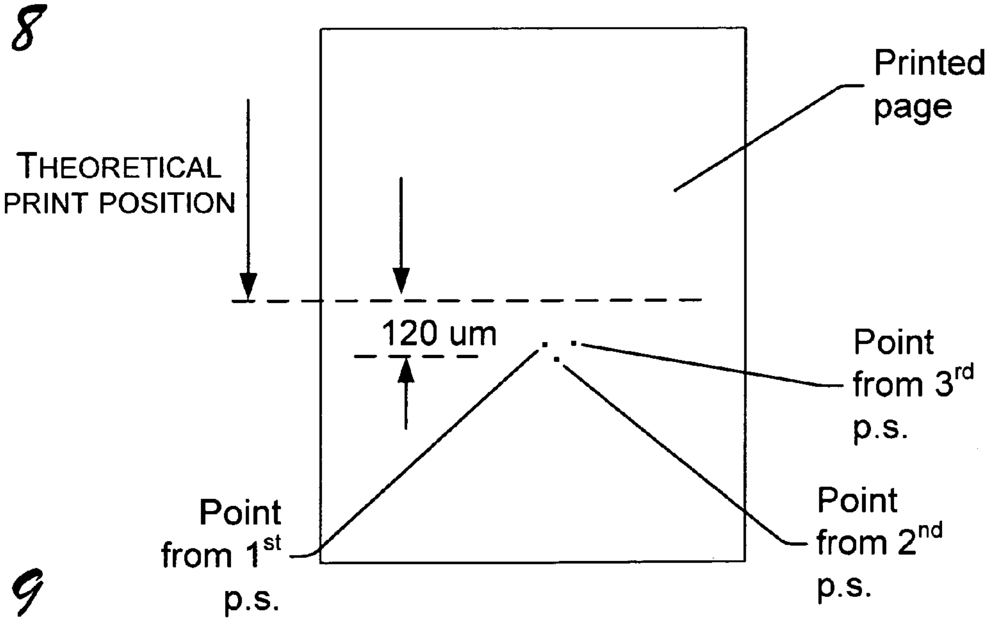
FIG. 9 is an example of a printed page with dots of different colors printed using print-station-individual advance information.

If, in contrast to a common encoder, individual encoders for each print station are used, the accumulated paper advance "seen" by the individual encoders is the same for all encoders. Assuming that the systematic encoding error is similar for all encoders (which is a reasonable assumption in many cases), each of the encoders therefore generates approximately the same accumulated error, so that each print station prints approximately at the same print position which deviates, for example, 120 μm from the theoretical print position. This is illustrated by FIG. 9 which shows a page with a printed point from each print station. Such a deviation from the absolute theoretical print position is mostly irrelevant, as explained above. However, in contrast to the common-encoder example of FIG. 8, such a print-station-individual encoding, since the print positions of the different print stations are shifted in common, improves the coincidence (i.e. the registration) of the images of the different print stations.

In some of the embodiments, the belt is also provided with at least one index marking. The index marking is indicative of a certain reference position of the conveyor. Measurement of the reference position provides absolute-position information of the conveyor in the advance direction. The index marking may, for example, be arranged beside the encoding marks. As the encoding marks, the index marking may, for example, be printed or etched onto the surface of the belt or may be attached as a strip to the belt's edge, and it is moved together with the belt. In the embodiments with an index marking, the sensor arrangements associated with each print station are also responsive to the index marking and detect it when it passes.

The signals generated by the sensor arrangement in response to the index marking enable the reference position of the belt to be determined with respect to each print station. In embodiments without index marking the distances between the print stations (in terms of encoding marks) are accurately known and it is assumed that these distances remain constant, in order to register the images of the different print stations. However, small variations of the distances between the different print stations or between the encoding marks on the belt may occur due to thermal, mechanical or other influences. Typically, these variations take place fairly gradually, i.e. during one print-out the distances can be considered as constant. In the embodiments with index marking the actual distances between the print stations are taken into account and used to further improve the longitudinal registration accuracy of the images printed by the different print stations.

In some of the embodiments, the detection of the index marking at the different print stations is used to define the position at which the respective print station starts to print to achieve longitudinal image registration. When the conveyor is moved in the advance direction, and the passage of the index marking is detected at the individual print stations, the number of encoding marks passing the respective print stations are individually counted for each print station. The process of counting starts with the detection of the index marking at each print station (for example, the print-station-individual counters are reset when the index-marking passes the respective print station). When the first print station starts to print an image (which it can do at any belt position relative to the index marking), the first print station's corresponding encoding-mark count is recorded. In some of the embodiments the encoding-mark count recorded corresponds to an image reference position which lies a certain distance ahead of the first image dot (a "dot" is a printable dot which may or may not be printed rather than only an actually printed dot). In other embodiments, the position of the first image dot itself is used as the reference position the encoding-mark count recorded. When the same count as the recorded count is reached at a subsequent print station's encoding-mark counter, the subsequent print station starts to print its image in an analogous way. More precisely, the conveyor position at which the same encoding mark count is reached is considered as the image reference position for the respective subsequent print station. For example, if the image reference position lies a certain distance ahead of the first image dot, the subsequent print station starts to print its image the same distance after the reference position as the first print station. If the reference position corresponds to the first image dot, it accordingly starts to print its image on the reference position. In this way, the individual images will be aligned with high accuracy, without assuming fixed predetermined distances between the print stations.

Typically, the printing resolution is much higher (i.e. the grid of points which can be printed is much finer) than the distance between the encoding marks. The grid of printable dots in the advance direction may, for example, be defined by a clock synchronized with the advance mechanism of the belt which subdivides the distance between two encoding marks into a large number of printable dots. In order to define the image reference position at the individual print stations with the higher printing resolution, not only the encoding marks are counted during the conveyor movement, but also the number of clock counts for those encoding mark intervals which only partly pass the sensor arrangement. Therefore, if the image reference position lies somewhere between two encoding marks at the first station, the corresponding clock counts are also recorded, and are used to define the image reference point at the respective subsequent print station, in addition to the recorded encoding mark count, whereby a registration with sub-encoding resolution is achieved.

In other embodiments, the actual distances between the print stations in terms of encoding marks are measured (or "calibrated") by means of the index marking. In these embodiments, during the calibration process the belt is moved past the sensor arrangements so that both the index marking and the encoding marks are detected by the sensor arrangements of each print station. By counting the signals generated by the encoding marks moving past one of the sensor arrangements in the period in which the index marking generates a first signal at the sensor arrangement of a first print station and a second signal at the sensor arrangement of a subsequent second print station (and by counting the clock counts for subintervals of encoding marks), the distance between the first and the second print station in terms of encoding marks (and clock counts for subintervals of encoding marks) is determined. In a subsequent printing process the information obtained during the calibration process is used to control the print stations to print the single-color patterns onto each other with a higher registration accuracy than the accuracy achieved with the assumption of fixed known distances between print bars. The use of the calibration information in the printing process can be illustrated by a simple example in which the first print station prints a dot in the first color, and the second print station ought to print onto the dot with the second color. Triggered by the printing of the dot at the first print station, the encoding marks (and the clock counts for subintervals of encoding marks) are counted at the sensor arrangement of the second print station during the movement of the belt. When the number of encoding marks and clock counts is reached which corresponds to the number obtained during the calibration process, the second print station is triggered to print its dot.

In the embodiments using calibration, the calibration and printing processes may be asynchronously or synchronously carried out. In some of the asynchronous embodiments, a "calibration run" may be performed without a printing task, for example when the printer is switched on or, regularly, when it is in a standby-mode. The belt may then be moved for the calibration only, without a recording medium on it. In other asynchronous embodiments, the belt movement during printing is also used for the calibration. Depending on the position of the index marking, the calibration information may only be available when the printing is already progressing, so that it will not be used any more in the present print-out, but only in the next one (which is the reason for also calling these embodiments "asynchronous"). In synchronous embodiments a calibration is carried out shortly before a print process, and the calibration information is immediately used in this print process. The print medium is fed onto the conveying belt such that the index marking is detected by a print station prior to or at the beginning of the print process at this print station. The provision of more than one index marking may be advantageous, in particular in synchronous embodiments, because they enable the recording medium to be put on the belt at different positions. Sufficient distance between two consecutive index markings is chosen to enable their signals from two consecutive print stations to be resolved (which, for example, is the case if it is larger than the distance between two consecutive print stations). Both types of asynchronous calibration methods as well as asynchronous and synchronous calibration methods may be combined.

In other embodiments an active lateral registration can be performed, i.e. a compensation of displacements of the belt in a direction normal to the printing direction (i.e. in a lateral direction) in the printing plane. For this purpose, first and second encoder marks associated with the conveyor are provided. They may be disposed in stripes in an edge area of the belt, as mentioned above. The first encoder marks are, for example, arranged perpendicular to the printing direction, whereas the second encoder marks are inclined to the first encoder marks. The first and second encoder marks have the same pitch; they are arranged in fixed relative positions and thereby form pairs; for example, each inclined encoder mark is, at one of its ends, coincident with one of the ends of a non-inclined encoder mark. In other embodiments, both marks are inclined with respect to each other and with respect to the lateral direction.

During the printing operation the first and second encoder marks are moved past the sensor arrangements of the different print stations and generate consecutive first and second encoder signals. The signals from a pair of encoding marks are correlated. The offset between them is a measure of the lateral position of the belt. If the lateral belt position changes, the offset between the two signals of a pair changes, because the inclination of the second encoder marks changes the timing of the second encoder signal with respect to the first encoder signal. Depending on the direction of the lateral displacement, the offset between the signals of a pair increases or decreases. Thus, an offset change of the signal pairs between two print stations represents the amount and the direction of the lateral displacement of the belt between the two print stations.

In some embodiments this information is used to control the print operation of the print stations following the first print station to laterally counter-shift the pattern printed by the following print stations so as to correct for a detected lateral displacement between print stations. The lateral displacement measurement and correction may be individually performed for each print station following the first one. Thereby, the lateral registration of the different images printed onto each is improved.

Such a lateral correction is also advantageous without using the index-marking information described above, because it improves the lateral registration accuracy. Therefore, some embodiments with a lateral displacement correction and print-station-individual advance encoding do not have an index marking, but rather use an assumption of the print station distances. Other embodiments combine the use of print-station-individual advance encoding including considering the actual print station positions by using the index marking, as described above, with the described lateral displacement correction, so as to obtain an improved longitudinal and lateral registration.

In some of the embodiments, the second encoder marks are inclined at an angle of about 45° to the laterally-oriented first encoder marks. The observed offset change then relates the lateral displacement in a simple manner to the longitudinal advance of the belt (the lateral displacement equals the advance the belt makes during an interval which corresponds to the offset change).

Some embodiments use a conveying drum instead of a conveying belt. The print stations are not disposed in a plane which is parallel to the surface plane of the belt, but in a peripheral surface which extends in a predetermined distance from the circumferential surface of the drum.

The sensor arrangements are, for example, arranged to detect transparent marks or opaque marks, i.e. the detecting sensor and a corresponding light source may be arranged on opposite sides of the encoding section or on the same side.

In the embodiments, the sensor arrangements are fixedly attached to the print station so as to represent the actual longitudinal and lateral positions of the print stations with respect to the marks on the belt.

Returning now to FIG. 1, a multicolor printer has several (here: four) successively arranged print stations 1. A conveying belt 2 is arranged beneath the print stations 1, guided by two rollers 3, wherein at least one of the rollers 3 is driven by an advance mechanism in an advance or longitudinal direction 4. The belt 2 conveys on its outer surface 5 a print medium 6, 7, e.g. a paper sheet which is fed onto the outer surface 5 and is moved during printing past the print stations 1. The printer is a large-format page-width printer, e.g. an ink-jet printer. Its print-width is, in one embodiment, about 24 inches or 610 mm (for A1 and ANSI D paper formats). Other embodiments have a larger print width, for example, in the range of 30–40 inches or 760–1020 mm (for A0, ISO B0 and ANSI E paper formats), or even larger than 40 inches or 1020 mm (for larger paper formats). Each print station 1 extends in a lateral direction 20 normal to the advance direction 4 across the width of the belt 2. Owing to the successive arrangement of the print stations, when the print medium 6 is conveyed a certain point on it subsequently passes the individual print stations 1. In order to produce a multicolor image in which the single-color images are coincident, the print stations generate their single-color patterns in a time-shifted (i.e. staggered) manner which compensates for the fact that a point on the paper does not pass all the print stations simultaneously, but only subsequently passes the individual print stations 1, so that the single-color images are registered.

One edge of the belt 2 is provided with a marking section 9 carrying marks 10, 11, 12. A complementary sensor arrangement 13 is associated with each print station 1 and is arranged to detect the mark 10, 11, 12. Each sensor arrangement 13 is fixedly attached to its print station 1 so that the sensor arrangement's longitudinal and lateral position represent the print station's position to which it is attached, apart from a constant offset vector describing the relative position of the sensor arrangement 13 and its print station 1 in the longitudinal and lateral directions. When the print station's position changes, e.g. due to thermal expansion, the sensor arrangement's position is therefore correspondingly changed. The offset vectors are accurately known and, preferably, are equal at all print stations 1.

The sensor arrangements 13 are connected to a print controller 14 by signal lines 15 which transfer the detected sensor signals. The print controller 14 is also connected to the advance mechanism and, by control and data lines 16, to each print station 1. It translates image data representing the image to be printed and received from outside into printing commands for each print station 1. It performs the translation such that the single-color patterns printed by each of the individual print stations 1 are registered. In the registration procedure, it determines the position and the advance of the belt 2 individually for each print station 1, based on the information provided by the sensor arrangement 13 for the respective print station 1, and uses this print-station-individual position and advance determination to register the pattern to be printed by this print station 1 to the pattern already printed by a previous prints station or stations.

FIG. 2 shows an optoelectronic sensor arrangement 13 with an index-marking sensor 17 responsive to an index marking 10 and an encoder mark sensor 18 responsive to encoding marks 11. The belt 2 has one index marking 10, indicative of a reference position of the conveyor, or, in other embodiments, more than one index marking 10 which, preferably, have a distance of at least the distance between two consecutive print stations 1. The encoding marks 11 have a similar shape and color (i.e. they are practically indistinguishable) and are equally spaced along the entire marking section 9. When the index marking 10 or one of the encoding marks 11 passes the index-marking sensor 17 or the encoding mark sensor 18, an index-marking signal or an encoding-mark signal is generated and sent to the print controller 14. Such signals are generated in each of the sensor arrangements 13 at the different print stations 1. The print controller 14 uses the number of encoding-marks 11 counted at each print station 1 since the last detection of the index marking at the respective print station 1 as a measure of the current conveyor position with respect to the respective print station 1. As explained above, clock counts coupled to the advance mechanism are counted in addition to the encoding marks 11 to obtain a sub-encoding-mark resolution. The print-station-individual conveyor-position information obtained in this manner is used to register the individual images (or patterns) in the longitudinal direction.

In embodiments carrying out a calibration of the print-station distances, the print controller 14, during calibration, deduces from the number of calibration mark signals counted between the index-marking signals from two (preferably consecutive) print stations 1 the distance between these print stations in terms of encoding marks. Clock counts coupled to the advance mechanism may be counted in addition to obtain a sub-encoding-mark resolution. During the printing process, the print controller 14 uses the number of counted calibration mark signals, clock counts and the calibration information to deduce the longitudinal position and advance of the belt, individually for the different print stations 1, and bases the registration of the different color patterns on this.

FIG. 3 shows a sensor arrangement 13 with an additional encoding sensor 19 and complementary additional encoding marks 12 which enable displacements of the sensor arrangement 13 relative to the belt 2 in the lateral direction 20 to be measured. The additional encoding marks 12 extend the laterally oriented first encoding marks 11 at a relative angle of, for example, 45°. The additional encoding sensor 19 is responsive to them and generates a second encoding-mark signal when one of the additional encoding marks 12 passes the sensor 13. This signal is shifted to the signal of the first encoding mark sensor 18 caused by the associated first encoding mark 11. The direction and amount of the shift is a measure of the lateral position of the belt at the respective print station 1. The print controller 14 receives these signals from all print stations 1, deduces information about the lateral belt displacement from one print station to the next print station from it, and uses this information to correct the lateral registration of the patterns printed by the different print stations 1 for the lateral displacement.

Figure 4:
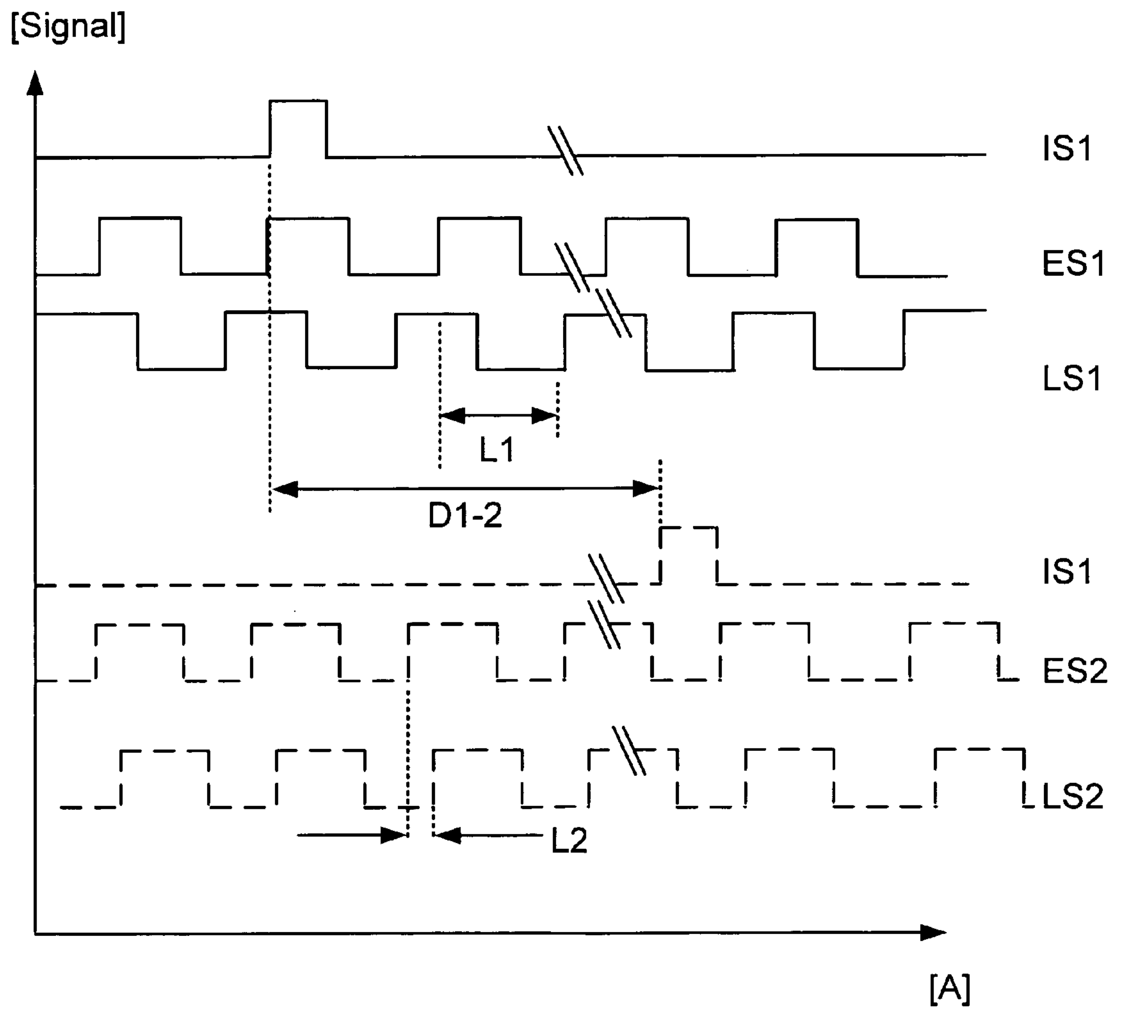
FIG. 4 shows a diagram of signals of sensor arrangements according to FIG. 3 at two different print stations.

FIG. 4 illustrates the correlation of the signals from the sensor arrangements 13 of two different (e.g. adjacent) print stations 1, called first and second print stations, and their use for the image registration. A first set of signals IS1, ES1 LS1 from the first print station is represented by full lines, and a second set of signals IS2, ES2, LS2 from the second print station is represented by dashed lines. IS1, IS2 indicate index-marking signals; ES1, ES2 indicate non-inclined encoding-mark signals; LS1, LS2 indicate inclined encoding-mark signals; and A indicates the advance of the belt 2. An index marking signal IS1 from the first print station is observed when the index marking 10 passes the first print station, and another index-marking signal IS2 is observed from the second print station when it passes the second print station. Encoding mark counters of the first and second print stations are individually reset by the index-marking signals IS1, IS2 from the first and second print stations, respectively. The advance of the belt 2 is individually determined in terms of encoding marks at the first and second print stations by individually counting the encoding-mark signals ES1 from the first print station 1 and the encoding-mark signals ES2 from the second print station 2 (clock counts are not considered in the example of FIG. 4).

In embodiments in which the distance between the print stations is calibrated, the number of encoding signals (for example, ES2) counted in the interval between IS1 and IS2 represents the distance D1–2 between the first and second print stations 1 in terms of encoding marks.

The non-inclined and the inclined encoding-mark signals ES1, LS1, ES2, LS2 are correlated; the correlation between them enables the lateral belt between the first and second print stations to be measured. At the first print station, an offset L1 between associated non-inclined and inclined encoding signals ES1 and LS1 is observed. In the case of a lateral belt displacement, at the second print station a different offset L2 between associated signals ES2 and LS1 is observed. The difference L2–L1 of these offsets (which is, for example, determined by the print controller 14) is a measure of the lateral belt displacement between the first and second print stations. This lateral displacement information is used by the print controller 14 in the lateral registration of the patterns printed by the different second station. A corresponding lateral displacement correction is individually carried out for a further print station in the same manner, based on the lateral displacement information measured at each print station.

Figure 5:
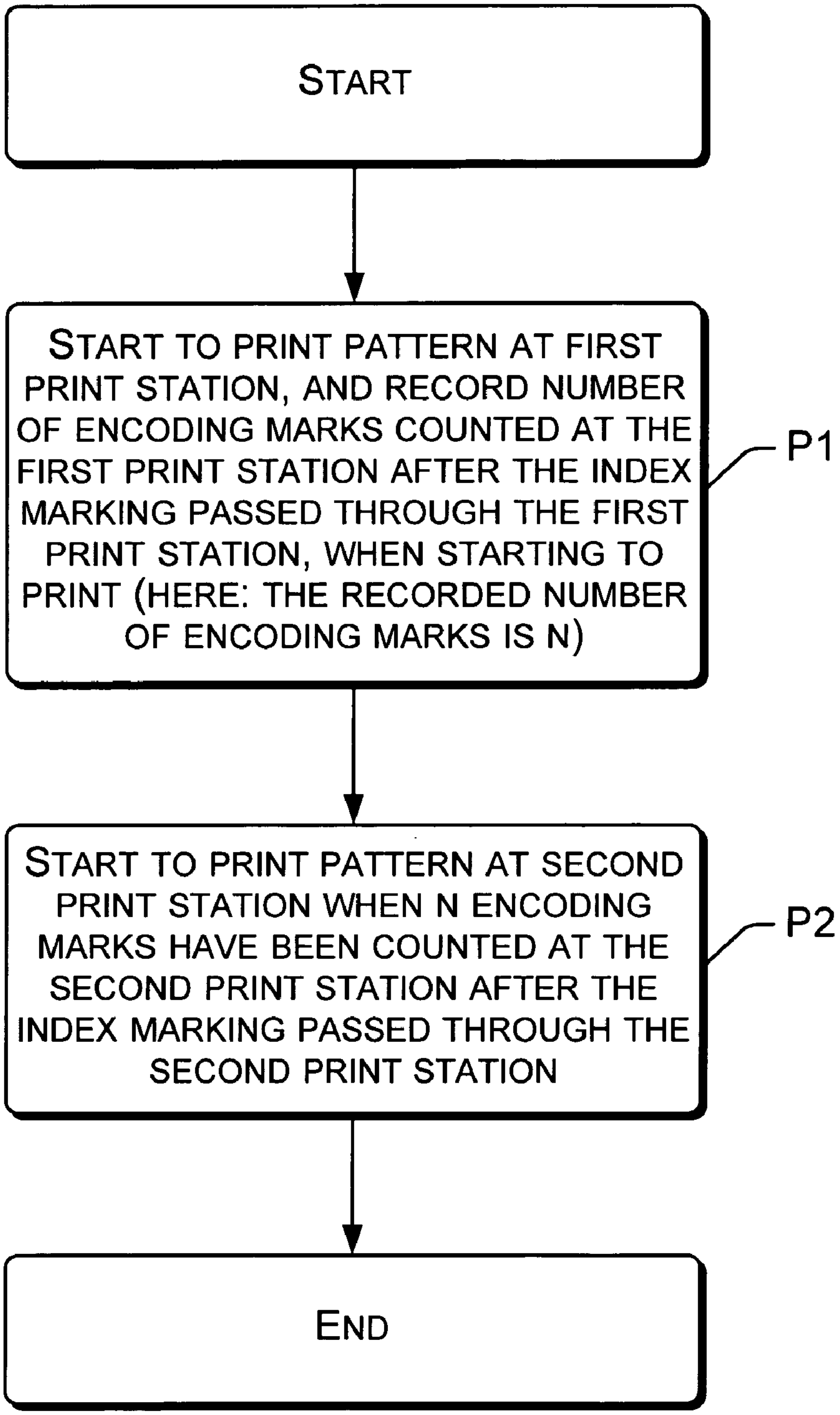
FIG. 5 is a flow chart of a printing method.

The flow chart of FIG. 5 illustrates a method of printing a multicolor-image. In step P1 the first print station starts to print its pattern. At the same time, the number of encoding marks counted after the index marking passed through the first print station is recorded. In the example of FIG. 5, n encoding marks passed through the first station; therefore the number recorded is n. In step P2, when n counts have been counted at the second print station after the index marking passed through the second print station, the second print station starts to print its pattern. In this way, the second print station's pattern is registered to the pattern printed by the first print station. Registering the patterns printed by the subsequent print stations is performed in the same manner.

Figure 6:
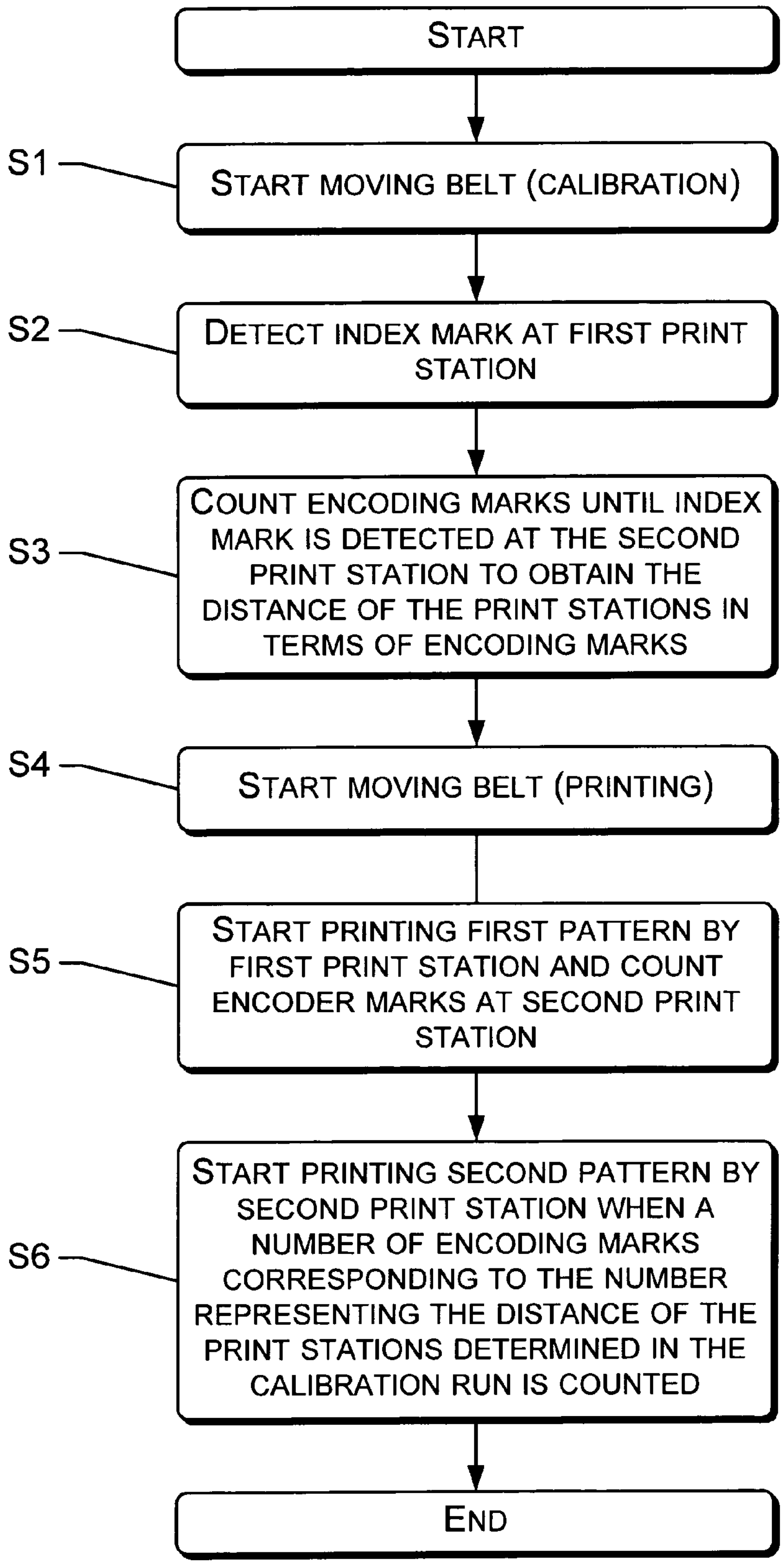
FIG. 6 is a flow chart of another embodiment of a printing method, based on a calibration of the distances between print stations.

The flow chart of FIG. 6 illustrates another embodiment of a method of printing a multicolor-image, based on a calibration of the distances between the print stations. It may be subdivided into a "calibration run" (steps S1 to S3) and the actual print process (steps S4 to S6). In step S1 the belt movement is started to perform the calibration. In step S2, the index marking 10 is detected at the first print station 1. In step S3, which starts upon the detection of the index marking 10 at the first station 1, the encoding marks 11 are counted at the first or second print station, until the index marking 10 is detected at the second print station 1. The number of encoding marks counted (including clock counts which measure the sub-encoding intervals before the first and after the last encoder mark) represent the distance between the first and second print stations 1. If more than two print stations are provided, the calibration run is continued until the distance of each print station with respect to the first print station or the respective preceding print station is determined in the same manner. In step S4, the belt movement is started for printing (if the belt was at rest). In step S5, printing of the first pattern by the first print station is started, and encoder marks/clock counts are counted at the second print station. In step S6, printing of the second color pattern at the second print station is started when the number of encoding marks/clock counts corresponds to the number representing the distance from the second to the first print station, as determined in the calibration run before. Thereby the second pattern is registered to the pattern printed by the first printing station. Registering the patterns printed by subsequent print stations is performed in the same manner. Step S4 can be dropped if the belt movement started in step S1 is continued for the print process. Calibrating and printing may be interleaved; for example, in asynchronous calibration, in which the calibration information is only used for the next print-out. But also in synchronous calibration, the first print step, S4, may already commence during the calibration step S3, since in the calibration information is only needed shortly before the second print station starts printing.

Figure 7:
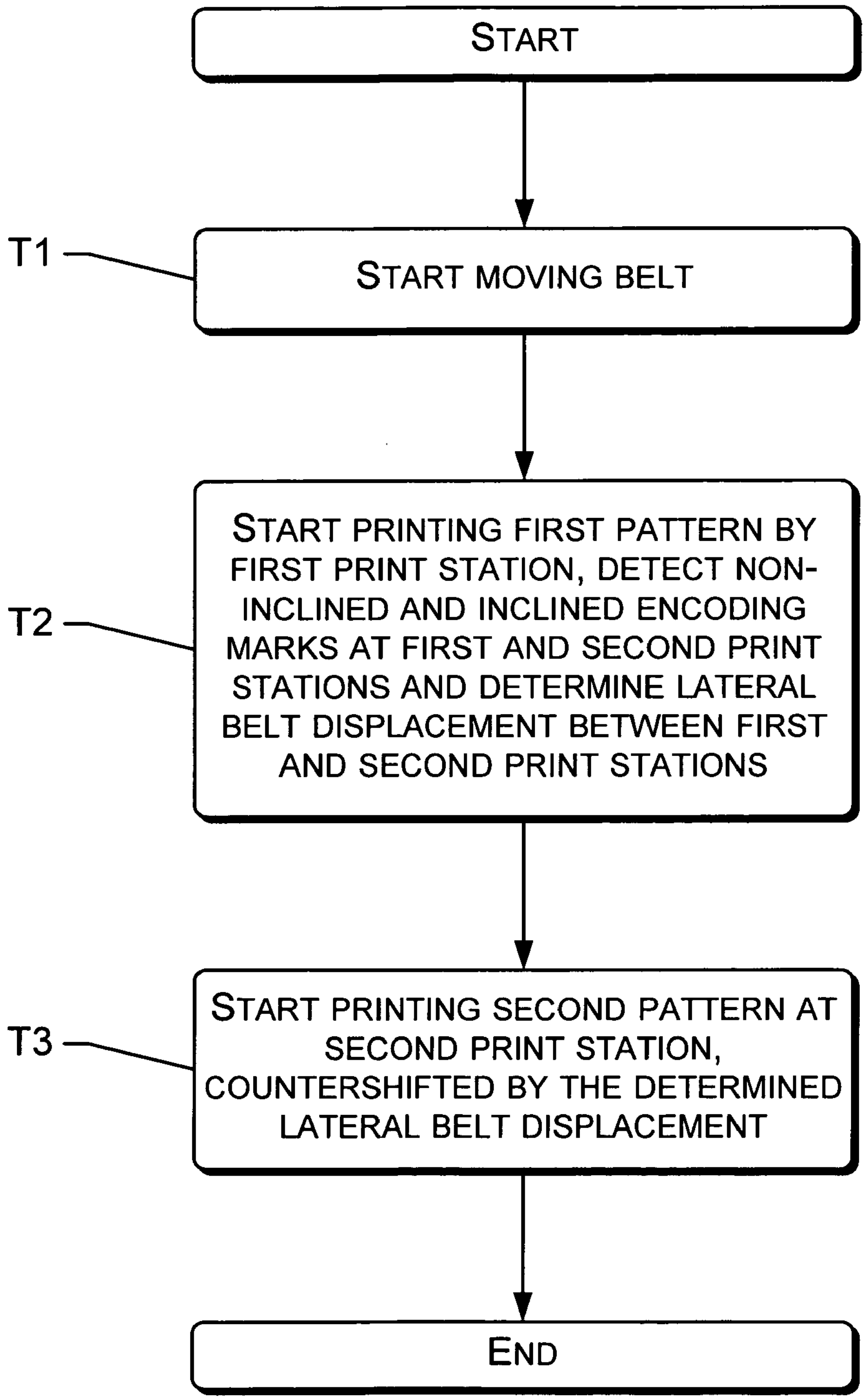
FIG. 7 is a flow chart of a printing method with lateral displacement compensation.

The flow chart of FIG. 7 illustrates an exemplary method of printing a multicolor-page in which lateral belt displacements are compensated. In step T1 the belt movement is started. In step T2, the first print station starts printing the first pattern. The non-inclined and inclined encoding marks 11, 12 are detected at the first and second print stations, and the lateral belt displacement between the first and second print stations is determined from an observed change of the offset between the non-inclined and inclined encoder mark signals from the first to the second printing station. In step T3 the second print station starts printing the second pattern, wherein the printed second pattern is countershifted by the determined lateral displacement so as to register the second pattern to the first one. A lateral displacement between the second and further print stations is compensated in the same manner.

Thus, the described embodiments enable individual images to be registered with improved accuracy, which enhances images quality.

All publications and existing systems mentioned in this specification are herein incorporated by reference.

Although certain methods and products constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A multicolor-printer, comprising:

a plurality of print stations arranged to generate an image on a recording medium during the movement of the recording medium;

a recording medium conveyor;

a plurality of similar first encoding marks arranged along the conveyor, sensor arrangements associated with the print stations, responsive to the first encoding marks and arranged to generate signals providing information about the movement of the conveyor with respect to the corresponding print station;

at least one index marking indicative of a reference position of the conveyor;

wherein the sensor arrangements are arranged to generate a signal responsive to the index marking, thereby providing information about the reference position of the conveyor with respect to the corresponding print station; and wherein the printer is arranged to register images of different print stations with each other based on the movement and reference-position information.

2. The multicolor-printer of claim 1, further comprising second encoding marks associated with the conveyor and inclined to the first encoding marks;

the sensor arrangements being arranged to also generate second signals from the second encoding marks, wherein the first and second signals are related and their relation bears information about a conveyor displacement in a lateral direction with respect to the corresponding print station; and wherein the printer is arranged to register images of different print stations with each other based on the movement and lateral-displacement information.

3. The multicolor-printer of claim 1, arranged to count the encoding marks starting with the detection of the index marking at each print station;

start to print an image, by the first print station, and record a corresponding encoding-mark count of the first print station;

start to print an image, by a subsequent print station in response to equality of the subsequent print station's encoding-mark count and the recorded first print station's encoding-mark count.

4. The multicolor-printer of claim 1, wherein at least one of the first encoding marks and the at least one index marking are provided on an encoder section at an edge of the conveyor.

5. The multicolor-printer of claim 1, wherein at least one of the first encoding marks and the at least one index marking are applied to the conveyor by etching or are attached to the conveyor on a strip.

6. The multicolor-printer of claim 1, wherein the sensor arrangements are attached to their respective print stations.

7. The multicolor-printer of claim 1, wherein the sensor arrangements comprises a first encoder sensor and an index-marking sensor.

8. The multicolor-printer of claim 1, wherein the printer is an ink-jet printer.

9. The multicolor-printer of claim 1, wherein the printer is a page-width printer.

10. The multicolor-printer of claim 1, wherein the printer is a large-format printer.

11. A multicolor-printer, comprising:

a plurality of print stations arranged to generate an image on a recording medium;

a conveyor arranged to move the recording medium in an advance direction;

a plurality of similar first encoding marks arranged along the conveyor, sensor arrangements associated with the print stations, responsive to the first encoding marks and arranged to generate first signals providing information about the advance movement of the conveyor with respect to the corresponding print station;

second encoding marks inclined to the first encoding marks;

wherein the sensor arrangements are arranged to also generate second signals from the second encoding marks, wherein the first and second signals are related and their relation bears information about a conveyor displacement in a lateral direction with respect to the corresponding print station; and wherein the printer is arranged to register images of different print stations with each other based on the movement and lateral-displacement information.

12. The multicolor-printer of claim 11, further comprising at least one index marking indicative of a reference position of the conveyor;

wherein the sensor arrangements are arranged to also generate a signal responsive to the index marking, thereby providing information about the reference position of the conveyor with respect to the corresponding print station; and wherein the printer is arranged to register images of different print stations with each other in the advance direction based on the movement and reference-position information.

13. The multicolor-printer of claim 11, wherein the second encoding marks are inclined to the lateral direction at an angle of approximately 45°.

14. The multicolor-printer of claim 11, wherein the first encoding marks and the second encoding marks are provided on an encoder section at an edge of the conveyor.

15. The multicolor-printer of claim 11, wherein the sensor arrangements are attached to their respective print stations.

16. The multicolor-printer of claim 11, wherein the sensor arrangements comprises a first and a second encoder sensor.

17. A method of printing images onto each other on a recording medium using a printer having a plurality of print stations and a recording medium conveyor equipped with a plurality of similar first encoding marks and at least one index marking indicative of a reference position of the conveyor, comprising:

moving the conveyor in an advance direction, thereby detecting the index marking and the encoding marks and counting the encoding marks starting with the detection of the index marking at each print station;

starting to print an image, by the first print station, and recording a corresponding encoding-mark count of the first print station;

starting to print an image, by a subsequent print station in response to equality of the subsequent print station's encoding-mark count and the recorded first print station's encoding-mark count.

18. The method of claim 17, wherein the first print station's recorded encoding-mark count and the equal subsequent print station's recording-mark count correspond to an image reference position which passes the print stations before they actually start to print.

19. The method of claim 17, wherein the recording medium conveyor is also equipped with second encoding marks inclined to the first encoding marks, further comprising:

detecting the first and second encoding marks at each print station while moving the conveyor to print images on the recording medium, wherein detection signals of the first and second encoding marks are related and their relation bears information about a relative lateral conveyor displacement with respect to the corresponding print station, so as to obtain printing-station-related movement and lateral-displacement information; and registering the images also based on the lateral-displacement information.

20. A method of printing images onto each other on a recording medium using a printer having a plurality of print stations and a recording medium conveyor equipped with a plurality of similar first encoding marks and at least one index marking indicative of a reference position of the conveyor, comprising the steps of:

calibrating the distance between the print stations with reference to the encoding marks by moving the conveyor in an advance direction and detecting the at least one index marking, when moved past the print stations, while detecting the corresponding encoding marks;

moving the conveyor to print images on the recording medium while detecting the encoding marks at each print station, so as to obtain printing-station-related movement information; and registering the images being printed by the different print stations with each other based on the movement information and using the distance calibration.

21. The method of claim 20, wherein the recording medium conveyor is also equipped with second encoding marks inclined to the first encoding marks, further comprising:

detecting the first and second encoding marks at each print station while moving the conveyor to print images on the recording medium, wherein detection signals of the first and second encoding marks are related and their relation bears information about a relative lateral conveyor displacement with respect to the corresponding print station, so as to obtain printing-station-related movement and lateral-displacement information; and registering the images also based on the lateral-displacement information.

22. A method of printing images onto each other on a recording medium using a printer having a plurality of print stations and a recording medium conveyor equipped with a plurality of first and second encoding marks, wherein the second encoding marks are inclined to the first encoding marks, comprising the steps of:

moving the conveyor to print images on the recording medium while detecting the first and second encoding marks at each print station, wherein detection signals of the first and second encoding marks are related and their relation bears information about a relative lateral conveyor displacement with respect to the corresponding print station, so as to obtain printing-station-related movement and lateral-displacement information; and registering the images being printed by the different print stations with each other based on the movement and lateral-displacement information.

23. The method of claim 22, wherein the recording medium conveyor is also equipped with at least one index marking indicative of a reference position of the conveyor, further comprising:

upon moving the conveyor, detecting the index marking and counting at least the first encoding marks starting with the detection of the index marking at each print station;

starting to print an image, by the first print station, and recording a corresponding encoding-mark count of the first print station;

starting to print an image, by a subsequent print station in response to equality of the subsequent print station's encoding-mark count and the recorded first print station's encoding-mark count.

24. The method of claim 22, wherein the recording medium conveyor is also equipped with at least one index marking indicative of a reference position of the conveyor, further comprising:

calibrating the distance between the print stations with reference to the first encoding marks by moving the conveyor in an advance direction and detecting the at least one index marking, when moved past the print stations, while detecting the corresponding first encoding marks;

moving the conveyor to print images on the recording medium while detecting the first and second encoding marks at each print station, so as to obtain also printing-station-related movement information; and registering the images being printed by the different print stations with each other in the movement direction based on the movement information and using the distance calibration.

* * * * *